(12) United States Patent
Jin et al.

(10) Patent No.: US 8,836,117 B2
(45) Date of Patent: Sep. 16, 2014

(54) ELECTRONIC DEVICE HAVING A CONTACT RECESS AND RELATED METHODS

(71) Applicant: STMicroelectronics Pte. Ltd, Singapore (SG)

(72) Inventors: Yonggang Jin, Singapore (SG); How Yuan Hwang, Sitlawan (MY)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 86 days.

(21) Appl. No.: 13/652,937

(22) Filed: Oct. 16, 2012

(65) Prior Publication Data

US 2014/0103521 A1    Apr. 17, 2014

(51) Int. Cl.
*H01L 23/498* (2006.01)
*H01L 23/00* (2006.01)
*H01L 21/56* (2006.01)

(52) U.S. Cl.
CPC . *H01L 23/49811* (2013.01); *H01L 2924/18162* (2013.01); *H01L 2225/1035* (2013.01); *H01L 24/19* (2013.01); *H01L 2924/15311* (2013.01); *H01L 21/56* (2013.01); *H01L 2224/12105* (2013.01); *H01L 21/568* (2013.01)
USPC ............... 257/737; 257/777; 257/E23.068; 257/E21.502; 438/124

(58) Field of Classification Search
CPC ........ H01L 23/498; H01L 21/56; H01L 24/16
USPC ................. 257/737, 777, E23.068, E21.502; 438/124
See application file for complete search history.

(56) References Cited

U.S. PATENT DOCUMENTS

| 7,704,796 B2 | 4/2010 | Pagaila et al. |
| 8,183,696 B2 | 5/2012 | Meyer et al. |
| 2013/0187268 A1 * | 7/2013 | Lin et al. ........................ 257/737 |

* cited by examiner

*Primary Examiner* — S. V. Clark
*Assistant Examiner* — Krista Soderholm
(74) *Attorney, Agent, or Firm* — Allen, Dyer, Doppelt, Milbrath & Gilchrist, P.A.

(57) ABSTRACT

An electronic device may include a bottom interconnect layer and an integrated circuit (IC) carried by the bottom interconnect layer. The electronic device may further include an encapsulation material on the bottom interconnect layer and laterally surrounding the IC. The electronic device may further include electrically conductive pillars on the bottom interconnect layer extending through the encapsulation material. At least one electrically conductive pillar and adjacent portions of encapsulation material may have a reduced height with respect to adjacent portions of the IC and the encapsulation material and may define at least one contact recess. The at least one contact recess may be spaced inwardly from a periphery of the encapsulation material.

22 Claims, 5 Drawing Sheets

ELECTRONIC DEVICE HAVING A CONTACT RECESS AND RELATED METHODS

FIELD OF THE INVENTION

The present invention is related to the field of electronic devices and, more particularly to the field of integrated circuit carrying electronic devices, and related methods.

BACKGROUND OF THE INVENTION

As demands for a smaller electronic device increase, so do the demands for electronic device packaging methods to meet size demands and production efficiency. One method of making a reduced size electronic device is a package-on-package (PoP) method.

The PoP method is an integrated circuit (IC) packaging method that combines vertically discrete components or elements, for example, logic and memory ball grid array (BGA) packages. Two or more packages may be installed on top of each other, i.e. stacked, with an interface to route signals between them. This may allow higher component density in an electronic device, such as, for example, a mobile phone, a personal digital assistant (PDA), and a digital camera.

While the PoP process may be particularly beneficial for space savings in an electronic device, the PoP process may be particularly beneficial as components may be decoupled. In particular, a memory device, for example, may be decoupled from a logic device. Thus, the memory package may be tested separately from the logic package, and only those packages that passed quality checks may be used in final assembly (if the memory is bad, only the memory is discarded and so on). This is in contrast to stacked-die packages, for example, where the entire set of components is useless and rejected if either the memory or logic is bad.

Additionally, a manufacturer of a mobile phone or a digital camera, for example, may control logistics. In other words, one component, for example, the memory, from different suppliers or manufacturers can be used at different times without changing the logic.

Additionally, any mechanically mating top package can typically be used. For example, for a low-end mobile phone, a smaller memory configuration may be used on the top package, while for a high-end mobile phone, more memory could be used with the same bottom package. This may simplify inventory control by the original equipment manufacturers (OEM). In contrast, for a stacked-die package or even package in package (PiP), the exact memory configuration must be known weeks or months in advance.

Electrically, the PoP method may advantageously reduce a length of electrical interconnections (i.e., track length) between different interoperating parts, such as, for example, a controller and a memory. This may improve electrical performance of devices, since shorter routing of interconnections between circuits may yield faster signal propagation and reduced noise and cross-talk. However, electrical interconnections are typically formed at the package level at the surface mounting stage.

U.S. Pat. No. 7,704,796 to Pagaila et al. discloses a semiconductor device, or more particularly, a semiconductor die, that includes recessed conductive vias. Each recessed conductive via is an exterior recess after the wafer is singulated into the semiconductor die.

Further improvements to electronic device packages, for example, PoP packaging, may be desired. More particularly, it may be desirable to reduce overall thickness, increase electrical efficiency, increase production efficiency, and increase mechanical robustness.

SUMMARY OF THE INVENTION

In view of the foregoing background, it is therefore desirable to provide an electronic device that has a reduced thickness, is readily manufactured, and that cooperates with other stacked electronic components to reduce overall thickness.

This and other objects, features, and advantages in accordance with the present invention are provided by an electronic device that may include a bottom interconnect layer and an integrated circuit (IC) carried by the bottom interconnect layer. The electronic device may further include an encapsulation material on the bottom interconnect layer and laterally surrounding the IC. The electronic device may further include a plurality of electrically conductive pillars on the bottom interconnect layer extending through the encapsulation material. At least one electrically conductive pillar and adjacent portions of encapsulation material may have a reduced height with respect to adjacent portions of the IC and the encapsulation material and may define at least one contact recess. The at least one contact recess may be spaced inwardly from a periphery of the encapsulation material. Accordingly, the electronic device may have a reduced thickness and may allow for an overall reduced thickness of stacked electronic components. For example, the contact recess may be particularly advantageous for reducing the overall thickness of stacked electronic components coupled at the contact recess.

The plurality of electrically conductive pillars may have a height within a range of 40%-60% of a height of adjacent portions of the IC and the encapsulation material, for example. The bottom interconnect layer and the IC may preferably have a combined height less than 300 microns, for example, and more preferably, a combined height less than 150 microns, for example.

The IC may include a semiconductor substrate having a plurality of bond pads coupled to the bottom interconnect layer. The encapsulation material may include thermosetting polymer, for example. The bottom interconnect layer may include a plurality of dielectric layers and at least one electrically conductive layer associated therewith, for example.

The electronic device may further include another IC and a plurality of electrically conductive contacts coupling another IC to respective ones of the plurality of electrically conductive pillars at the at least one contact recess, for example. The electronic device may also include a printed circuit board (PCB) and a plurality of electrically conductive contacts coupling the PCB to the bottom interconnect layer.

A method aspect is directed to a method of making an electronic device that may include coupling an integrated circuit (IC) to a bottom interconnect layer and positioning an encapsulation material on the bottom interconnect layer to laterally surround the IC. The method may include forming a plurality of electrically conductive pillars on the bottom interconnect layer to extend through the encapsulation material, for example. At least one electrically conductive pillar and adjacent portions of encapsulation material may be formed to have a reduced height with respect to adjacent portions of the IC and the encapsulation material and may define at least one contact recess. The at least one contact recess may be spaced inwardly from a periphery of the encapsulation material, for example.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to refer to like elements in different embodiments.

Figure 1:
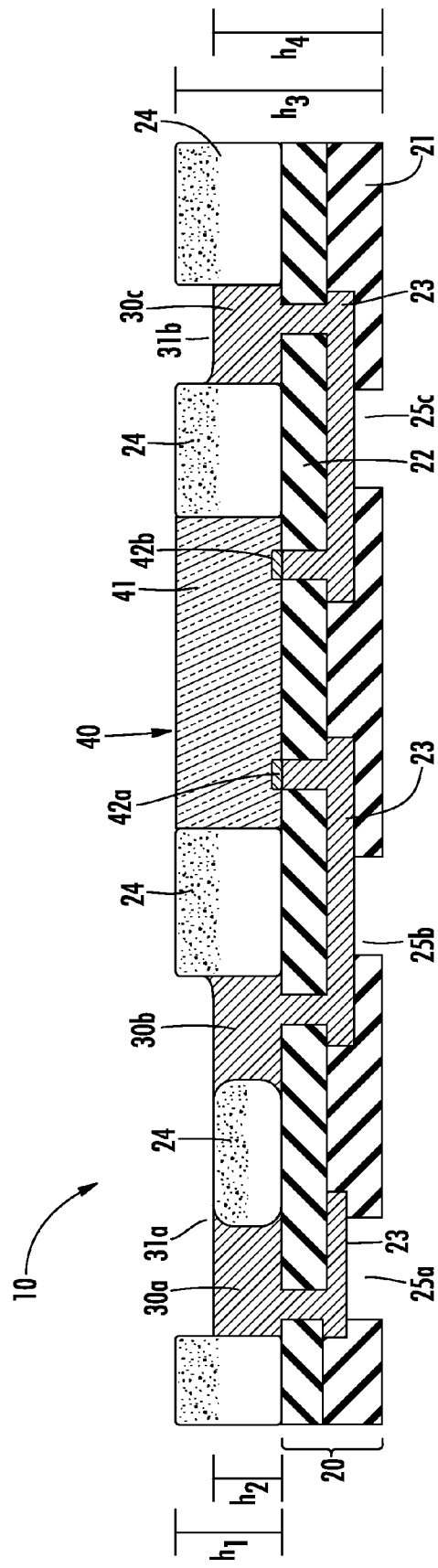
FIG. 1 is an enlarged schematic cross-sectional view of a portion of an electronic device in accordance with the present invention.

Referring initially to FIG. 1, an electronic device 10 illustratively includes a bottom interconnect layer 20. The bottom interconnect layer has first and second dielectric layers 21, 22 in a stacked relation. An electrically conductive layer 23 defining a redistribution layer (RDL) is associated with the first and second dielectric layers 21, 22. More particularly, the electrically conductive layer 23 is carried between the first and second dielectric layers 21, 22, and extends to an upper surface of the second dielectric layer.

The electronic device 20 includes an integrated circuit (IC) 40 carried by bottom interconnect layer 20. More particularly, the IC 40 is carried by an upper surface of the second dielectric layer 22 and couples to the bottom interconnect layer 20 at the upper surface of the second dielectric layer. More particularly, the IC 40 illustratively includes a semiconductor substrate 41 and bond pads 42a, 42b coupled to the electrically conductive layer 23.

An encapsulation material 24 is on the bottom interconnect layer 20 and surrounds the IC 40. The encapsulation material 24 may include a thermosetting polymer or epoxy, for example. Of course, the encapsulation layer 24 may include another type of dielectric material.

The electronic device 10 also includes electrically conductive pillars 30a-30c on the bottom interconnect layer 20 extending through the encapsulation material 24. The electrically conductive pillars 30a-30c and adjacent portions of encapsulation material have a reduced height with respect to adjacent portions of the IC 40 and the encapsulation material 24 thereby defining respective contact recesses 31a, 31b. The contact recesses 31a, 31b are illustratively spaced inwardly from a periphery of the encapsulation material 24. In other words, the electrically conductive pillars 30a, 30b and the encapsulation material 24 therebetween have a reduced height with respect to adjacent portions of the IC 40 and the encapsulation material on both sides of the electrically conductive pillars thereby defining an interior contact recess 31a. The electrically conductive pillar 30c has a reduced height with respect to adjacent portions of the IC 40 and the encapsulation material on both sides of the electrically conductive pillar thereby defining another interior contact recess 31b.

While two electrically conductive pillars 30a, 30b are associated with the contact recess 31a, it will be appreciated by those skilled in the art that one or more electrically conductive pillars may be associated with the contact recess. Moreover, while one electrically conductive pillar 30c is associated with the contact recess 31b, it will be appreciated by those skilled in the art that more than one electrically conductive pillar may be associated with the contact recess.

The electrically conductive pillars 30a-30c may have a height $h_2$ within a range of 40%-60% of a height $h_1$ of adjacent portions of the IC 40 and the encapsulation material 24, for example. The electrically conductive pillars 30a-30c may have a height in a different range of the height $h_1$ of adjacent portions of the IC 40 and the encapsulation material 24. Additionally, each electrically conductive pillar 30a-30c may have a different height.

The bottom interconnect layer 20 and the IC 40 may have a combined height $h_3$ less than 300 microns, for example. Of course, the combined height $h_3$ of the bottom interconnect layer 20 and the IC 40 may be a different height.

The bottom interconnect layer 20 and the electrically conductive pillars 30a-30c may have a combined height $h_4$ less than 150 microns, for example. The combined height of the electrically conductive pillars 30a-30c and the bottom interconnect layer 20 may be different, and may not be constant. In other words, in some embodiments, where, for example an upper surface of the electrically conductive pillars 30a-30c is curved, the combined height at the highest point may be less than 150 microns. In some embodiments, an epoxy flux may be positioned in the contact recesses 31a, 31b for increased ease of coupling, for example.

The bottom interconnect layer 20 illustratively includes bottom contact openings 25a-25c in a lower surface thereof. More particularly, the first dielectric layer 21 includes the bottom contact openings 25a-25c in a lower surface exposing the electrically conductive layer 23 for coupling to bottom contacts, as will be explained in further detail below.

Figure 2:
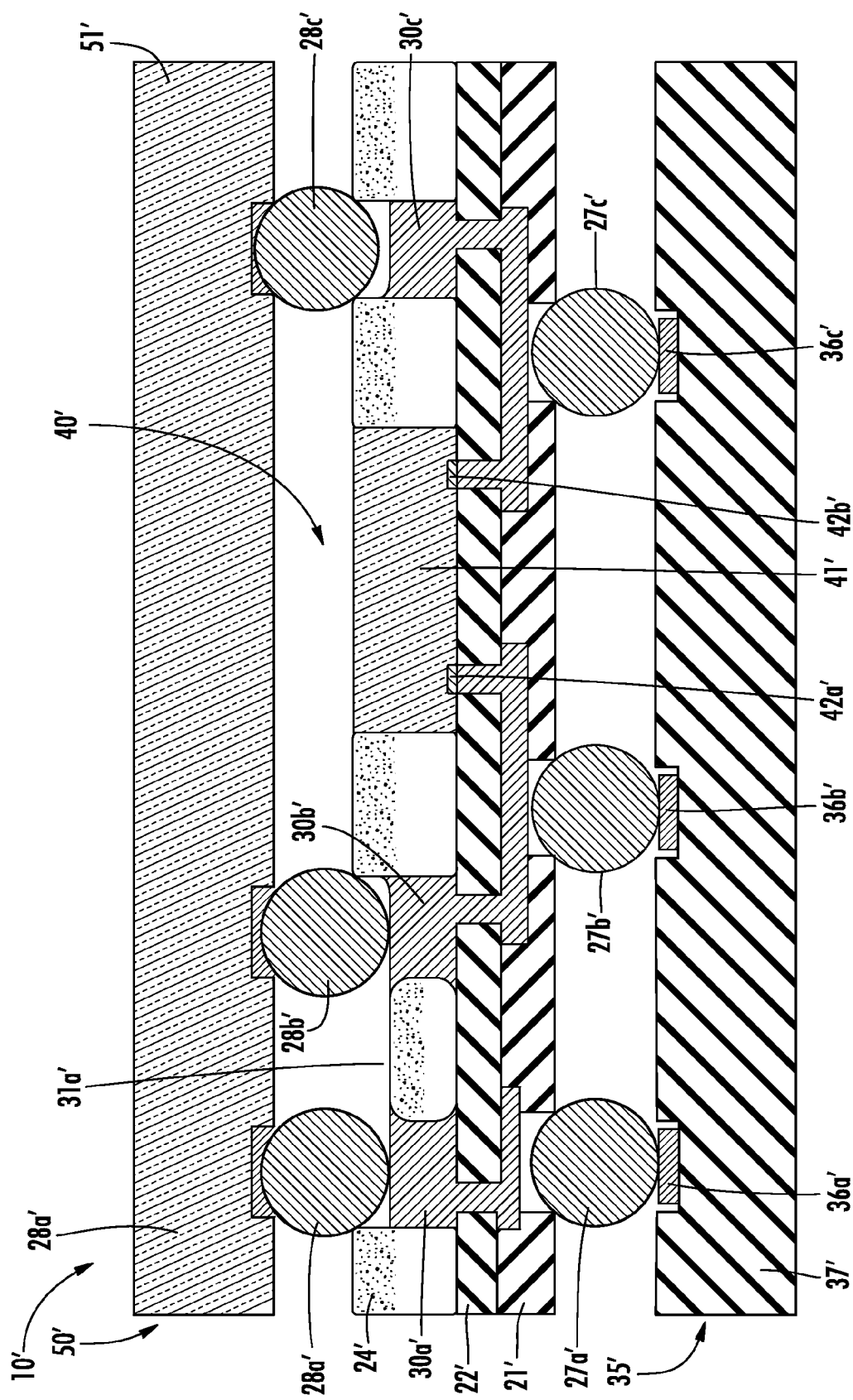
FIG. 2 is a schematic cross-sectional view of an electronic device in accordance with another embodiment of the present invention.
Figure 3:
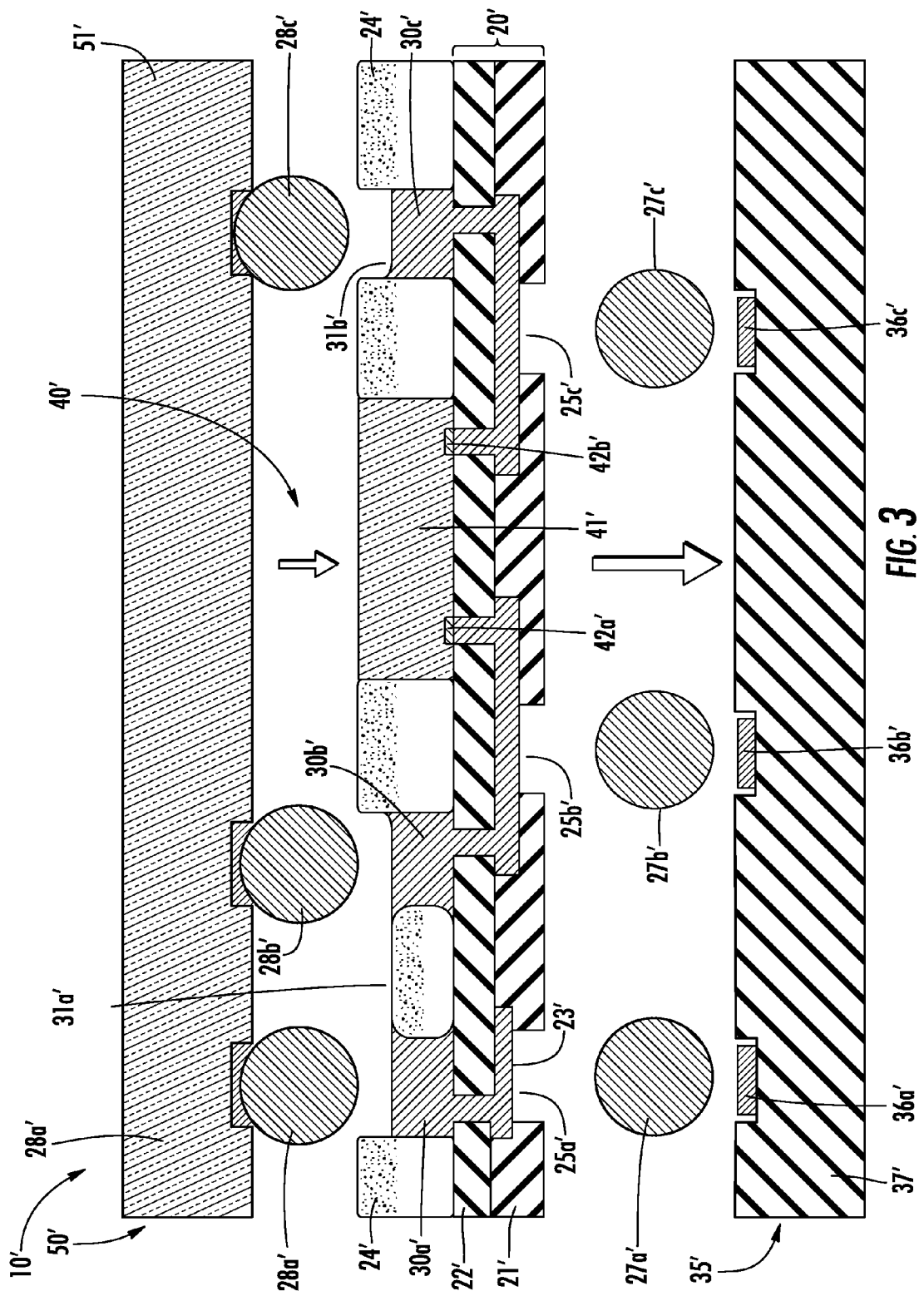
FIG. 3 is an exploded cross-sectional view of the electronic device of FIG. 2.

Referring now to FIGS. 2 and 3, in another embodiment, the electronic device 10' further includes bottom contacts 27a'-27c' carried by the bottom interconnect layer 20' and coupled to the electrically conductive layer 23' at respective bottom contact openings 25a'-25c'. The bottom contacts 27a'-27c' may each be electrically conductive balls defining a ball grid array, for example. Of course, the bottom contacts 27a'-27c' may be another type of contact. The bottom contacts 27a'-27c' may be for coupling to a printed circuit board (PCB) 35' or other IC package. The PCB 35' includes a dielectric substrate 37' and electrically conductive contacts 36a'-36c' coupling to respective bottom contacts 27a'-27c'.

The electronic device 10' further includes a further electronic device 50' or IC package. The further electronic device 50' includes a semiconductor substrate 51' and contacts 28a'-28c' for coupling to respective electrically conductive pillars 30a'-30c' at the first and second interior contact recesses 31a', 31b'. The contacts 28a'-28c' may each be electrically conductive balls defining a ball grid array, for example. Of course, the contacts 28a'-28c' may be another type of contact.

Figure 4A:
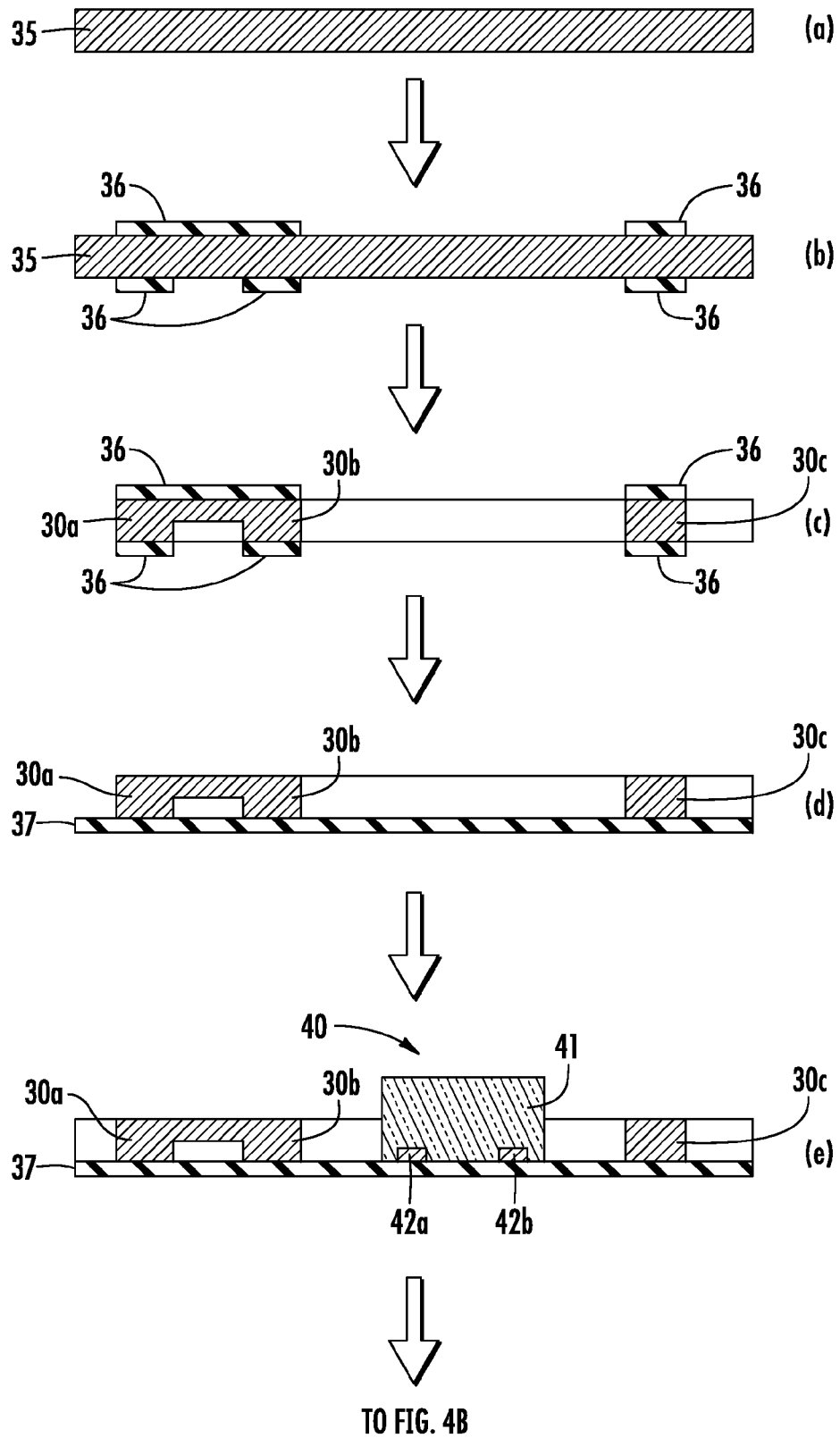
FIGS. 4a-4b are schematic cross-sectional views of an electronic device at different steps during a method of making the electronic device according to the present invention.
Figure 4B:
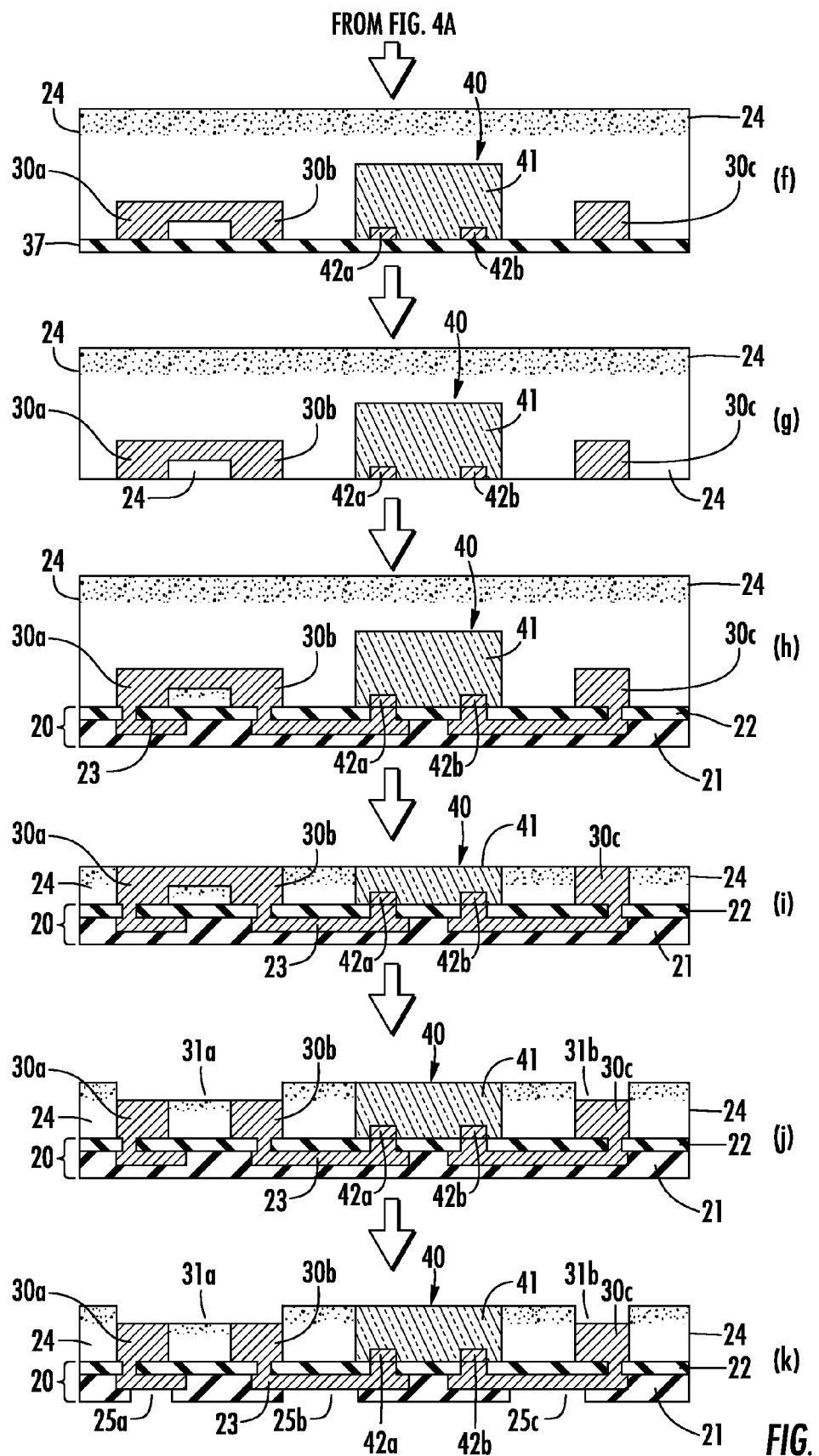

Referring now to FIGS. 4a and 4b a method of making an electronic device 10 is described. It should be noted that for ease of understanding, the electronic device 10 is shown and described after package singulation. In other words, the wafer is diced to form the single illustrated electronic device 10.

The method includes, beginning with a lead frame 35, for example, a copper lead frame (step a), applying a pattern of photoresist 36 to the upper and lower surfaces of the lead frame (step b). Through an etching process, for example, wet etching, exposed portions of the lead frame 35, i.e. not covered by the photoresist 36, are removed defining electrically conductive pillars 30a-30c (step c). The electrically conductive pillars 30a-30c may be held by a perimeter portion of the lead frame 35, for example.

The photoresist 36 coating the electrically conductive pillars is stripped (step d). A bonding carrier 37 is attached to the lower surface of the electrically conductive pillars 30a-30c (step d). An IC 40, such as that described above, for example, is placed between the second and third electrically conductive pillars 30b, 30c (step e).

The encapsulation material 24 is positioned laterally around the electrically conductive pillars 30a-30c and the IC 40 (step f). For example, the encapsulation material 24 may be positioned by a compression molding process. Of course, the encapsulation material 24 may be positioned using another process, as will be appreciated by those skilled in the art. The bonding carrier 37 is removed (step g).

The bottom interconnect layer 20 is formed at the lower surface of the IC 40 and the lower surface of the electrically conductive pillars 30a-30c (step h). The bottom interconnect layer is formed to have first and second dielectric layers 21, 22 in a stacked relation, and an electrically conductive layer 23 defining a redistribution layer (RDL) that is associated with the first and second dielectric layers 21, 22. Bottom contact openings are not yet formed in the bottom interconnect layer 20.

The electronic device 10 is thinned, for example, using a back-grinding process, as will be appreciated by those skilled in the art (step i). Of course, other processes may be used to thin the electronic device 10.

The method includes removing, through, for example, wet copper etching, portions of the electrically conductive pillars 30a-30c (step j) to define the contact recesses 31a, 31b. The portions of the electrically conductive pillars 30a-30c may be removed using other techniques as will be appreciated by those skilled in the art. Bottom contact openings 25a-25c are formed, for example, by laser ablation (step k). Of course, the bottom contact openings 25a-25c may be formed by other techniques, as will also be appreciated by those skilled in the art.

The removal of portions of the electrically conductive pillars 30a, 30b and adjacent portions of the encapsulation material 24 define an interior contact recess 31a (step k). The removal of a portion of the electrically conductive pillar 30c defines another interior contact recess 31b (step k). As noted above, the interior contact recesses 31a, 31b are described with respect to a singular electronic device 10 after singulation (step k).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
a bottom interconnect layer;
an integrated circuit (IC) carried by said bottom interconnect layer;
an encapsulation material on said bottom interconnect layer and laterally surrounding said IC; and
a plurality of electrically conductive pillars on said bottom interconnect layer extending through said encapsulation material, at least one electrically conductive pillar and adjacent portions of encapsulation material having a reduced height with respect to adjacent portions of said IC and said encapsulation material and defining at least one contact recess, the at least one contact recess being spaced inwardly from a periphery of said encapsulation material.

2. The electronic device of claim 1, wherein said plurality of electrically conductive pillars have a height within a range of 40%-60% of a height of adjacent portions of said IC and said encapsulation material.

3. The electronic device of claim 1, wherein said bottom interconnect layer and said IC have a combined height less than 300 microns.

4. The electronic device of claim 1, wherein said bottom interconnect layer and said plurality of electrically conductive pillars have a combined height less than 150 microns.

5. The electronic device of claim 1, wherein said IC comprises a semiconductor substrate having a plurality of bond pads coupled to said bottom interconnect layer.

6. The electronic device of claim 1, wherein said encapsulation material comprises thermosetting polymer.

7. The electronic device of claim 1, wherein said bottom interconnect layer comprises a plurality of dielectric layers and at least one electrically conductive layer associated therewith.

8. The electronic device of claim 1, further comprising another IC and a plurality of electrically conductive contacts coupling said another IC to respective ones of said plurality of electrically conductive pillars at the at least one contact recess.

9. The electronic device of claim 1, further comprising a printed circuit board (PCB) and a plurality of electrically conductive contacts coupling said PCB to said bottom interconnect layer.

10. An electronic device comprising:
a bottom interconnect layer;
an integrated circuit (IC) comprising a semiconductor substrate having a plurality of bond pads coupled to said bottom interconnect layer;
an encapsulation material on said bottom interconnect layer and laterally surrounding said IC;
a plurality of electrically conductive pillars on said bottom interconnect layer extending through said encapsulation material, at least one electrically conductive pillar and adjacent portions of encapsulation material having a reduced height with respect to adjacent portions of said IC and said encapsulation material and defining at least one contact recess, the at least one contact recess being spaced inwardly from a periphery of said encapsulation material; and
another IC and a plurality of electrically conductive contacts coupling said another IC to respective ones of said plurality of electrically conductive pillars at the at least one contact recess.

11. The electronic device of claim 10, wherein said plurality of electrically conductive pillars have a height within a range of 40%-60% of a height of adjacent portions of said IC and said encapsulation material.

12. The electronic device of claim 10, wherein said bottom interconnect layer and said IC have a combined height less than 300 microns.

13. The electronic device of claim 10, wherein said bottom interconnect layer and said plurality of electrically conductive pillars have a combined height less than 150 microns.

14. The electronic device of claim 10, wherein said encapsulation material comprises thermosetting polymer.

15. The electronic device of claim 10, wherein said bottom interconnect layer comprises a plurality of dielectric layers and at least one electrically conductive layer associated therewith.

16. The electronic device of claim 10, further comprising a printed circuit board (PCB) and a plurality of further electrically conductive contacts coupling said PCB to said bottom interconnect layer.

17. A method of making an electronic device comprising:
coupling an integrated circuit (IC) to a bottom interconnect layer;
positioning an encapsulation material on the bottom interconnect layer to laterally surround the IC; and
forming a plurality of electrically conductive pillars on the bottom interconnect layer to extend through the encapsulation material, at least one electrically conductive pillar and adjacent portions of encapsulation material being formed to have a reduced height with respect to adjacent portions of the IC and the encapsulation material and defining at least one contact recess, the at least one contact recess being spaced inwardly from a periphery of the encapsulation material.

18. The method of claim 17, wherein the plurality of electrically conductive pillars are formed to have a height within a range of 40%-60% of a height of adjacent portions of the IC and the encapsulation material.

19. The method of claim 17, wherein the bottom interconnect layer and the IC have a combined height less than 300 microns.

20. The method of claim 17, wherein the bottom interconnect layer and the plurality of electrically conductive pillars have a combined height less than 150 microns.

21. The method of claim 17, further comprising coupling a plurality of electrically conductive contacts of another IC to respective ones of the plurality of electrically conductive pillars at the at least one contact recess.

22. The method of claim 17, further comprising coupling a plurality of electrically conductive contacts of a printed circuit board (PCB) to the bottom interconnect layer.

* * * * *